(12) United States Patent
Li

(10) Patent No.: US 8,227,351 B2
(45) Date of Patent: Jul. 24, 2012

(54) FABRICATION OF MAGNETIC TUNNEL JUNCTION (MTJ) DEVICES WITH REDUCED SURFACE ROUGHNESS FOR MAGNETIC RANDOM ACCESS MEMORY (MRAM)

(75) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 192 days.

(21) Appl. No.: 12/728,294

(22) Filed: Mar. 22, 2010

(65) Prior Publication Data

US 2011/0229985 A1 Sep. 22, 2011

(51) Int. Cl.
*H01L 21/311* (2006.01)

(52) U.S. Cl. ....... 438/697; 438/3; 438/692; 257/E21.17; 257/E21.23; 257/E21.304; 257/E21.499; 257/E21.645; 257/E21.646

(58) Field of Classification Search .............. 438/3, 238, 438/381, 636, 622, 680, 692, 697, 678, 770, 438/782; 257/E21.17, 23, 304, 499, 645, 257/646

See application file for complete search history.

(56) References Cited

U.S. PATENT DOCUMENTS

| | | | | |
|---|---|---|---|---|
| 7,045,368 B2* | 5/2006 | Hong et al. | ..................... | 438/3 |
| 7,345,911 B2* | 3/2008 | Min et al. | ..................... | 365/158 |
| 7,476,919 B2* | 1/2009 | Hong et al. | ..................... | 257/295 |
| 7,579,197 B1* | 8/2009 | Li | ..................... | 438/3 |
| 7,884,433 B2* | 2/2011 | Zhong et al. | ..................... | 257/421 |
| 2004/0021188 A1 | 2/2004 | Low et al. | | |
| 2008/0258721 A1* | 10/2008 | Guo et al. | ..................... | 324/252 |
| 2010/0102404 A1 | 4/2010 | Li et al. | | |
| 2011/0049654 A1 | 3/2011 | Li et al. | | |

OTHER PUBLICATIONS

International Search Report and Written Opinion—PCT/US2011/029482, ISA/EPO—Jul. 5, 2011.

* cited by examiner

*Primary Examiner* — David Nhu
(74) *Attorney, Agent, or Firm* — Sam Talpalatsky; Nicholas J. Pauley; Jonathan T. Velasco

(57) ABSTRACT

Reliability and yield of MTJ devices is improved by reducing surface roughness in the MTJ layers of the MTJ devices. Surface roughness is reduced by reducing surface roughness of layers below the MTJ layers such as the bottom electrode layer. Planarizing the bottom electrode layer through chemical mechanical polishing or etch back of spin-on material before depositing the MTJ layers decreases surface roughness of the bottom electrode layer and the MTJ layers. Alternatively, a capping layer may be planarized before deposition of the bottom electrode layer and MTJ layers to reduce surface roughness in the capping layer, the bottom electrode layer, and the MTJ layers.

17 Claims, 11 Drawing Sheets

FABRICATION OF MAGNETIC TUNNEL JUNCTION (MTJ) DEVICES WITH REDUCED SURFACE ROUGHNESS FOR MAGNETIC RANDOM ACCESS MEMORY (MRAM)

TECHNICAL FIELD

The present disclosure generally relates to microelectronics. More specifically, the present disclosure relates to processing and manufacturing of magnetic tunnel junctions for magnetic random access memory (MRAM).

BACKGROUND

Magnetic tunnel junction (MTJ) devices organized into arrays and configured as magnetic random access memory (MRAM) operate at speeds of conventional dynamic random access memory (DRAM), are non-volatile, and do not need to be refreshed as in conventional DRAM. MRAM devices store data by altering magnetic properties of individual MTJ devices in the MRAM. MTJ devices are multi-layer devices including, for example, a non-magnetic dielectric layer sandwiched between two magnetic layers. Surface roughness of the layers in an MTJ affects the magnetic properties of the MTJ device by producing, for example, undesired coupling between layers of the MTJ device and tunneling. Thus, surface roughness may lead to failure and erratic behavior of MTJ devices in MRAM.

A cross-sectional view of conventional MTJ devices is shown in FIG. 1A. MTJ devices 100 include a dielectric layer 110 that surrounds a bottom metal 112. The bottom metal 112 is separated from the dielectric layer 110 by a barrier layer 114. The bottom metal 112 is filled through electroplating resulting in overdeposition of the bottom metal 112. After electroplating, the bottom metal 112 is planarized. During planarization, the etch rate of the dielectric layer 110 is faster than the bottom metal 112 resulting in a height difference between the dielectric layer 110 and the bottom metal 112. The height difference between the dielectric layer 110 and the bottom metal 112 adds surface roughness to any layers deposited on the dielectric layer 110 and the bottom metal 112.

A capping layer 116 is deposited on the dielectric layer 110 and the bottom metal 112. A via 132 is patterned in the capping layer 116 to the bottom metal 112 and a bottom electrode layer 120 is deposited on the capping layer 116 and the via 132. MTJ layers 122, 124, 126 are deposited and patterned on the bottom electrode layer 120 along with a capping layer 128 and a top electrode layer 130. The height variation between the capping layer 116 and the bottom metal 112 creates a surface roughness in the bottom electrode layer 120 and the MTJ layers 122, 124, 126. The via 132 also increases surface roughness in the bottom electrode layer 120 and the MTJ layers 122, 124, 126. The surface roughness may affect the operating characteristics of the MTJ devices 100. The effect of the surface roughness on the operating characteristics of the MTJ devices 100 may be enhanced as the dimensions of the MTJ devices 100 decrease in size.

Thus, there is a need to reduce surface roughness in MTJ devices.

SUMMARY

According to one aspect of the present disclosure, a magnetic tunnel junction (MTJ) manufacturing process includes depositing a capping layer on a dielectric layer and a bottom metal. The process also includes planarizing the capping layer. The process further includes depositing a bottom electrode layer on the planarized capping layer.

According to another aspect of the present disclosure, a magnetic tunnel junction (MTJ) manufacturing process includes the step of depositing a capping layer on a dielectric layer and a bottom metal. The process also includes the step of planarizing the capping layer. The process further includes the step of depositing a bottom electrode layer on the planarized capping layer.

According to a further aspect of the present disclosure, a magnetic tunnel junction (MTJ) manufacturing process includes depositing a bottom electrode layer on a capping layer and a bottom metal. The process also includes planarizing the bottom electrode layer. The process further includes depositing MTJ layers on the planarized bottom electrode layer.

According to yet another aspect of the present disclosure, a magnetic tunnel junction (MTJ) manufacturing process includes the step of depositing a bottom electrode layer on a capping layer and a bottom metal. The process also includes the step of planarizing the bottom electrode layer. The process further includes the step of depositing MTJ layers on the planarized bottom electrode layer.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

Figure 1A:
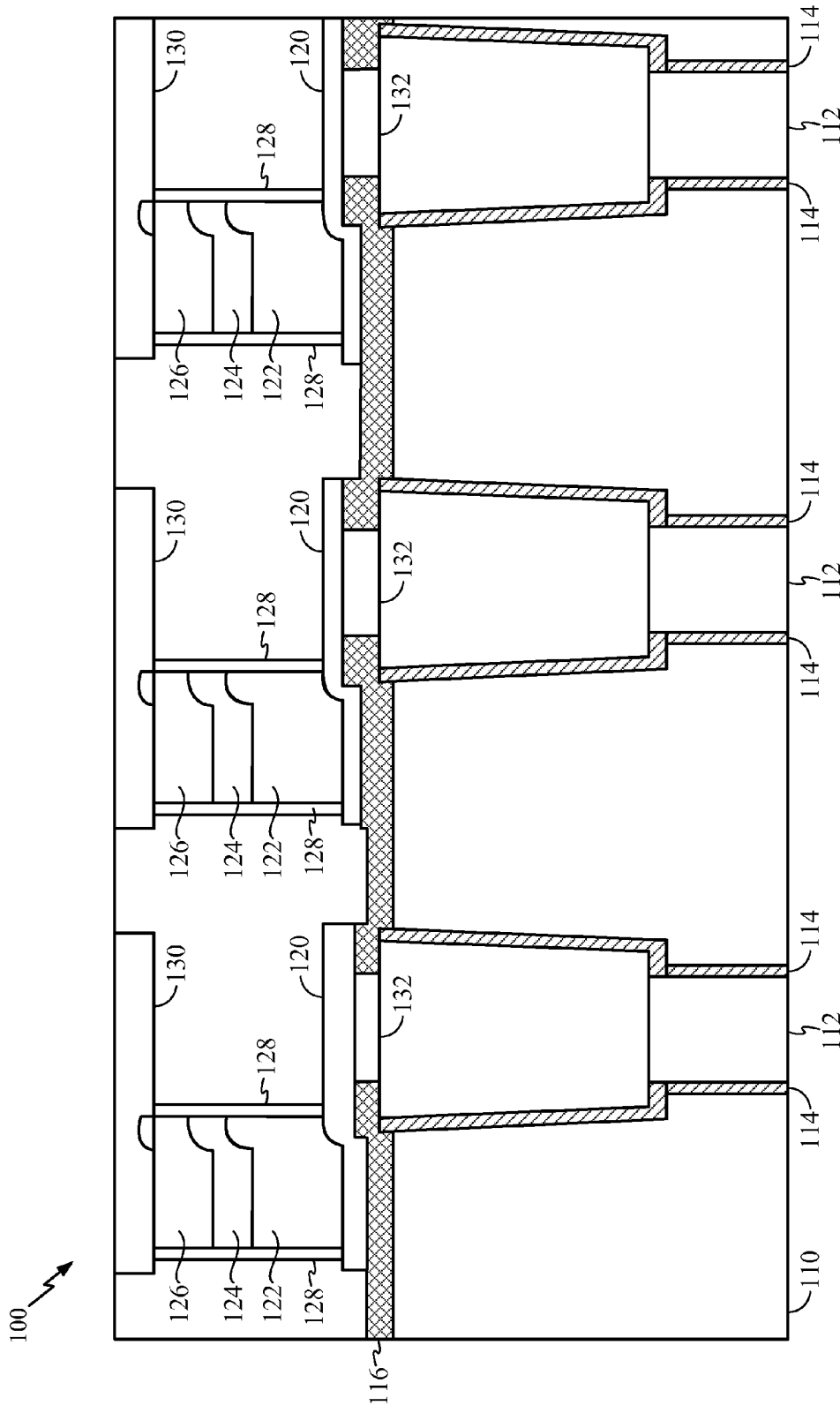
FIG. 1A is a cross-sectional view illustrating conventional MTJ devices.
Figure 2A:
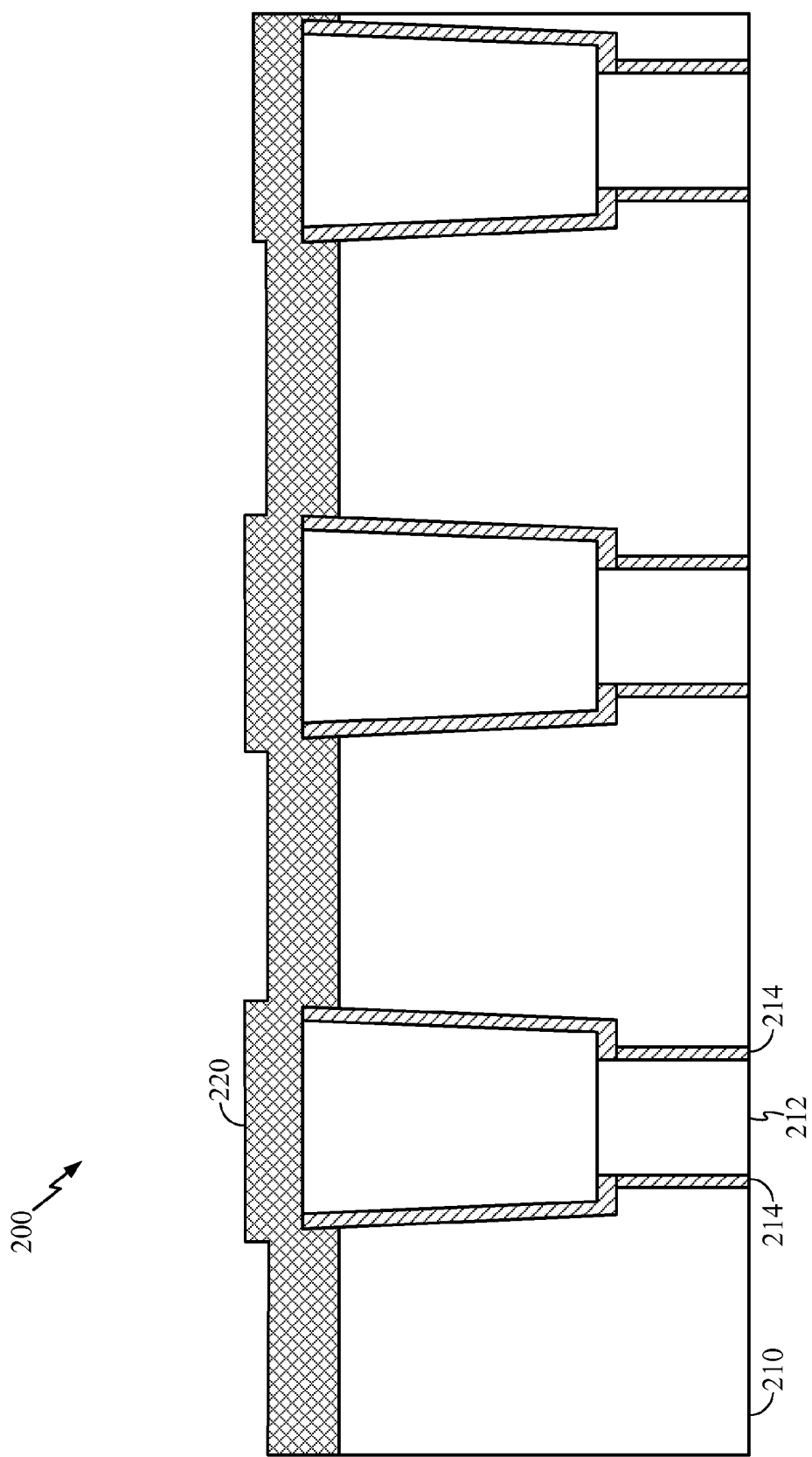
FIG. 2A is a cross-sectional view illustrating exemplary partial MTJ devices after deposition of a capping layer according to a first embodiment.
Figure 2B:
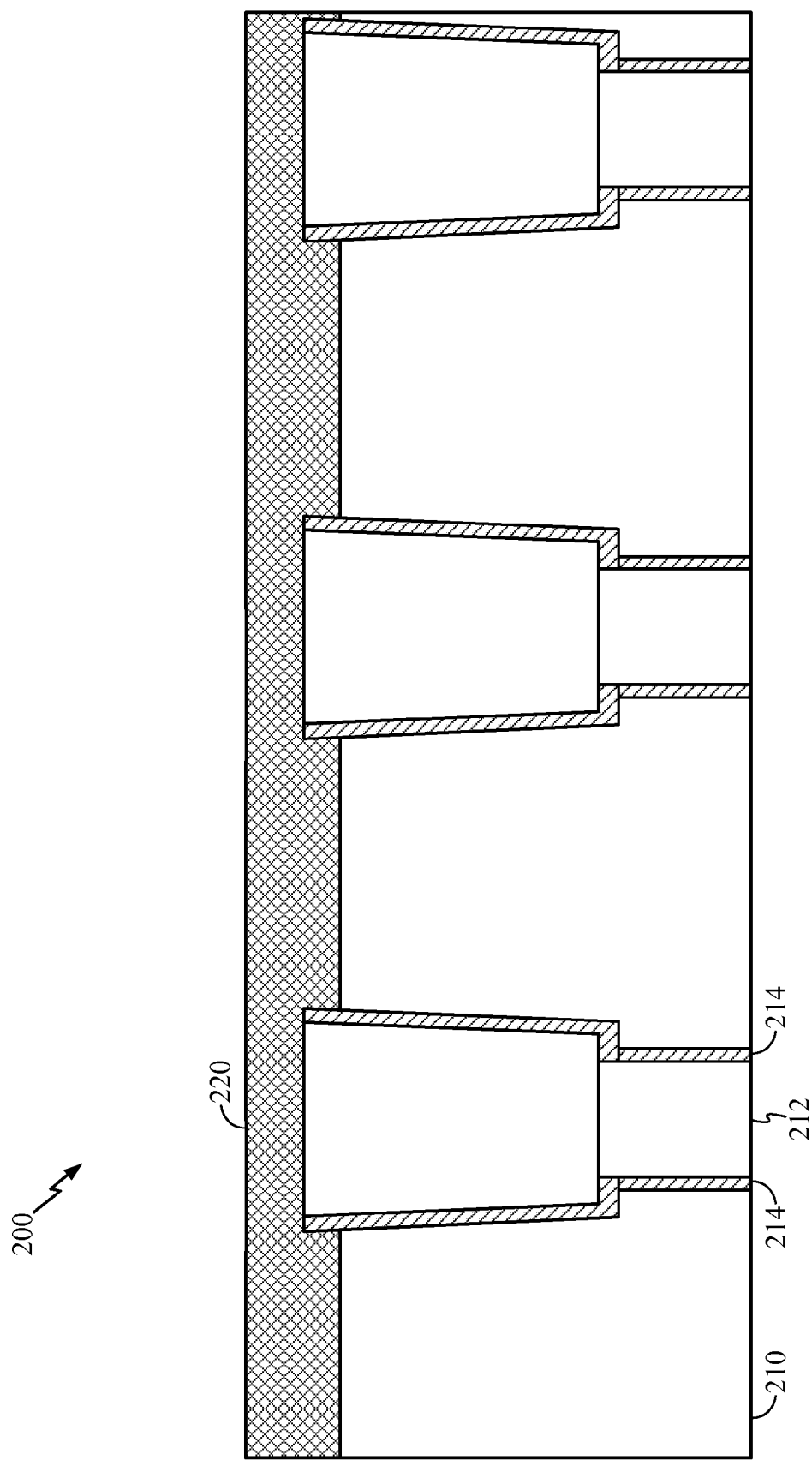
FIG. 2B is a cross-sectional view illustrating exemplary partial MTJ devices after planarization of the capping layer according to the first embodiment.
Figure 2C:
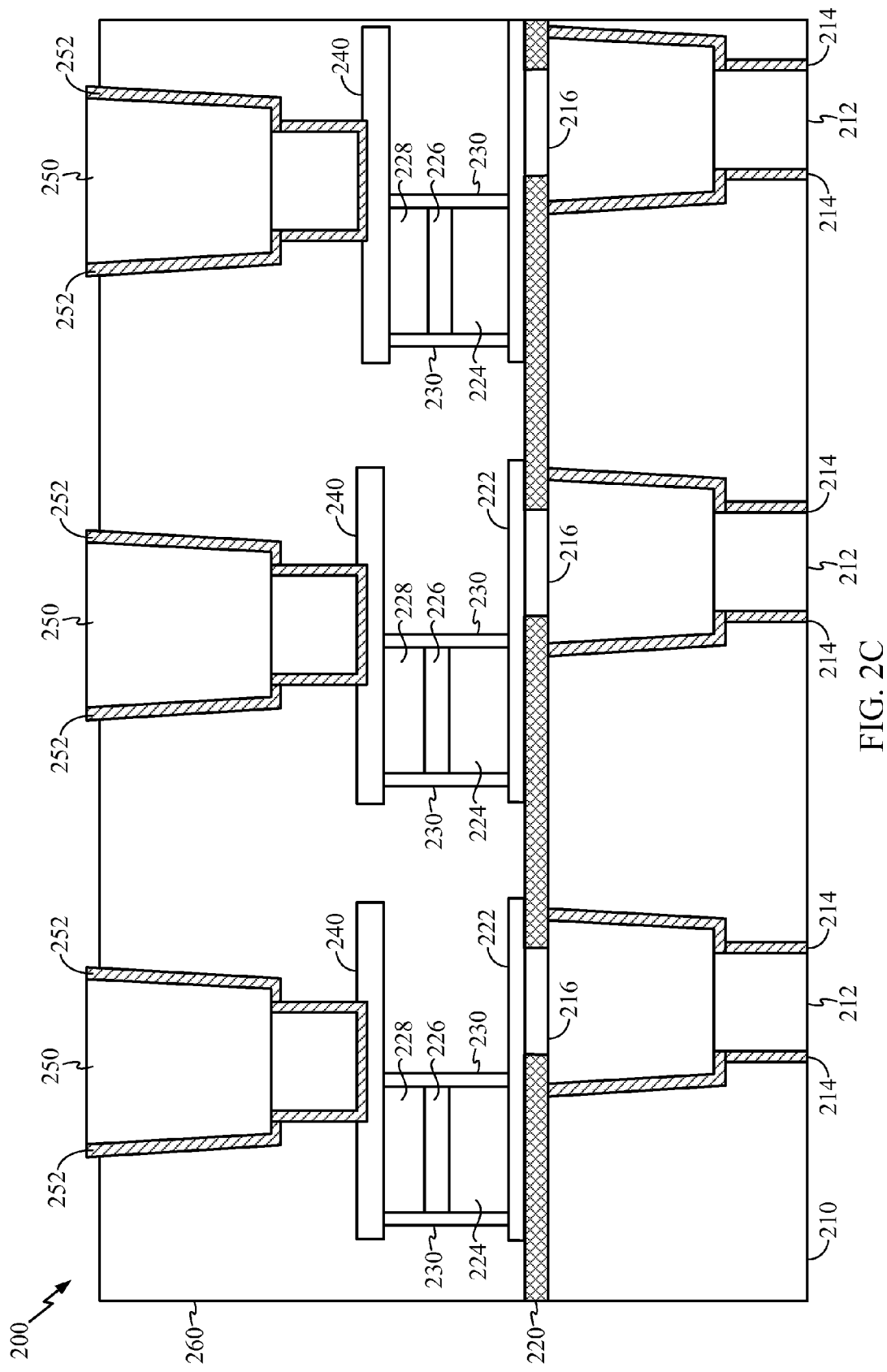
FIG. 2C is a cross-sectional view illustrating exemplary MTJ devices after patterning of the MTJ devices according to the first embodiment.

MTJ devices with decreased surface roughness may be manufactured by planarizing the capping layer or the bottom electrode layer before deposition of the MTJ layers. FIGS. 2A-2C will now be discussed with reference to FIG. 3 to describe exemplary manufacturing of MTJ devices with decreased surface roughness by planarizing the capping layer before deposition of the MTJ layers.

Figure 3:
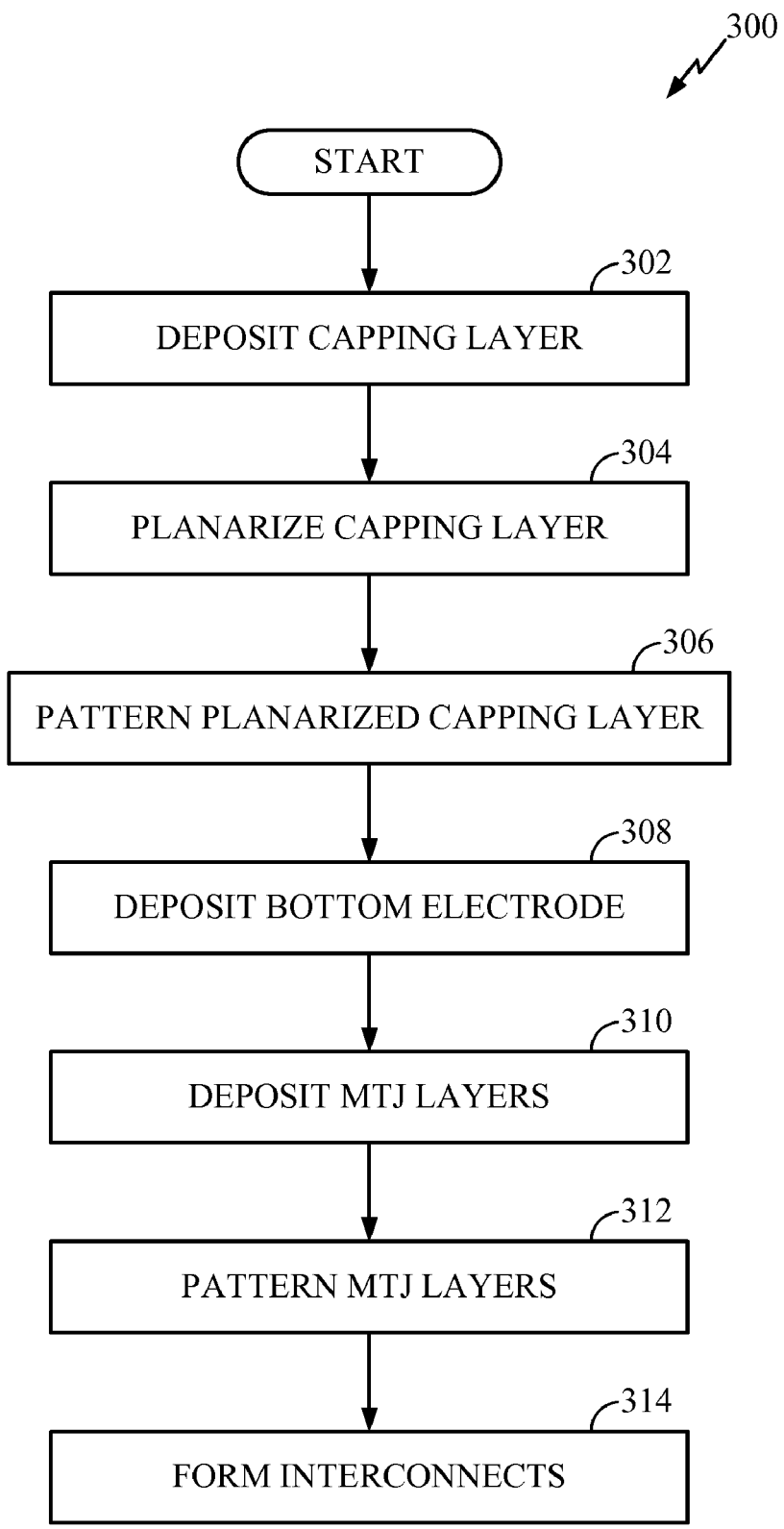
FIG. 3 is a flow chart illustrating an exemplary process for manufacturing MTJ devices according to a first embodiment.

FIG. 3 is a flow chart illustrating an exemplary process for manufacturing MTJ devices according to a first embodiment. A flow chart 300 for an exemplary manufacturing process of MTJ devices starts at block 302 with deposition of a capping layer 220 as illustrated in FIG. 2A. FIG. 2A is a cross-sectional view illustrating exemplary partial MTJ devices after deposition of a capping layer according to a first embodiment.

An interlayer dielectric (ILD) or intermetal dielectric (IMD) layer 210 includes a bottom metal 212. The bottom metal 212 is isolated from the dielectric layer 210 by a barrier layer 214. According to one embodiment, the barrier layer 214 is tantalum/tantalum nitride (Ta/TaN) or titanium/titanium nitride (Ti/TiN) and prevents diffusion of the bottom metal 212 into the dielectric layer 210. After depositing the bottom metal 212, the bottom metal 212 is planarized with the surface of the dielectric layer 210. During planarization of the bottom metal 212, the material of the bottom metal 212 etches at a slower rate than the material of the dielectric layer 210. As a result, the surface of the dielectric layer 210 is recessed below the bottom metal 212. Deposition of the capping layer 220 on the dielectric layer 210 and the bottom metal 212 may be conformal such that the surface of the capping layer 220 replicates the height variation of the dielectric layer 210 and the bottom metal 212.

After deposition of the capping layer 220 at block 302, the flow chart 300 continues to block 304 to planarize the capping layer 220. FIG. 2B is a cross-sectional view illustrating exemplary partial MTJ devices after planarization of the capping layer 220 according to the first embodiment. The capping layer 220 is planarized to remove height variation or surface roughness. According to one embodiment, planarization of the capping layer 220 includes chemical mechanical polishing. According to another embodiment, planarization of the capping layer 220 includes depositing a spin-on material (SOM) such as a polymer, spin on glass, organic films, or bottom anti-reflective coating (BARC) and etching back the spin-on material. After planarization, height variation and surface roughness of the capping layer 220 is reduced.

FIG. 2C is a cross-sectional view illustrating exemplary MTJ devices after patterning of the MTJ devices according to the first embodiment. After planarization of the capping layer 220 at block 304, the flow chart 300 continues to block 306 where the capping layer 220 may be patterned to create a via 216 to the bottom metal 212. At block 308, a bottom electrode layer 222 is deposited on the capping layer 220 and the via 216. At block 310, MTJ layers 224, 226, 228 are deposited on the bottom electrode layer 222. According to one embodiment, the MTJ layers 224, 226, 228 are annealed in a magnetic field after deposition. Annealing may be used, for example, to set an easy axis of the MTJ devices 200.

As shown in FIG. 2C, the MTJ layers 224, 226, 228 have reduced surface roughness because the capping layer 220 also has reduced surface roughness. Magnetic properties of the MTJ devices 200 are more predictable and reliable because of reduced height variation in the MTJ layers 224, 226, 228.

At block 312, the MTJ layers 224, 226, 228 are patterned. Additionally, a capping layer 230 may be deposited after patterning of the MTJ layers 224, 226, 228. According to one embodiment, the capping layer 230 protects the MTJ layers 224, 226, 228 from oxidation after patterning. At block 314 interconnects are formed and coupled to the MTJ layers 224, 226, 228. According to one embodiment, a dielectric layer is deposited and planarized level with the MTJ layer 228, a top electrode layer 240 is deposited on the MTJ layers 224, 226, 228, and the electrodes 222, 240 are patterned. Additionally, a dielectric layer 260 is deposited and planarized, and a top metal 250 that couples to the top electrode layer 240 is formed in the dielectric layer 260. A barrier layer 252 isolates the top metal 250 from the dielectric layer 260.

Figure 4A:
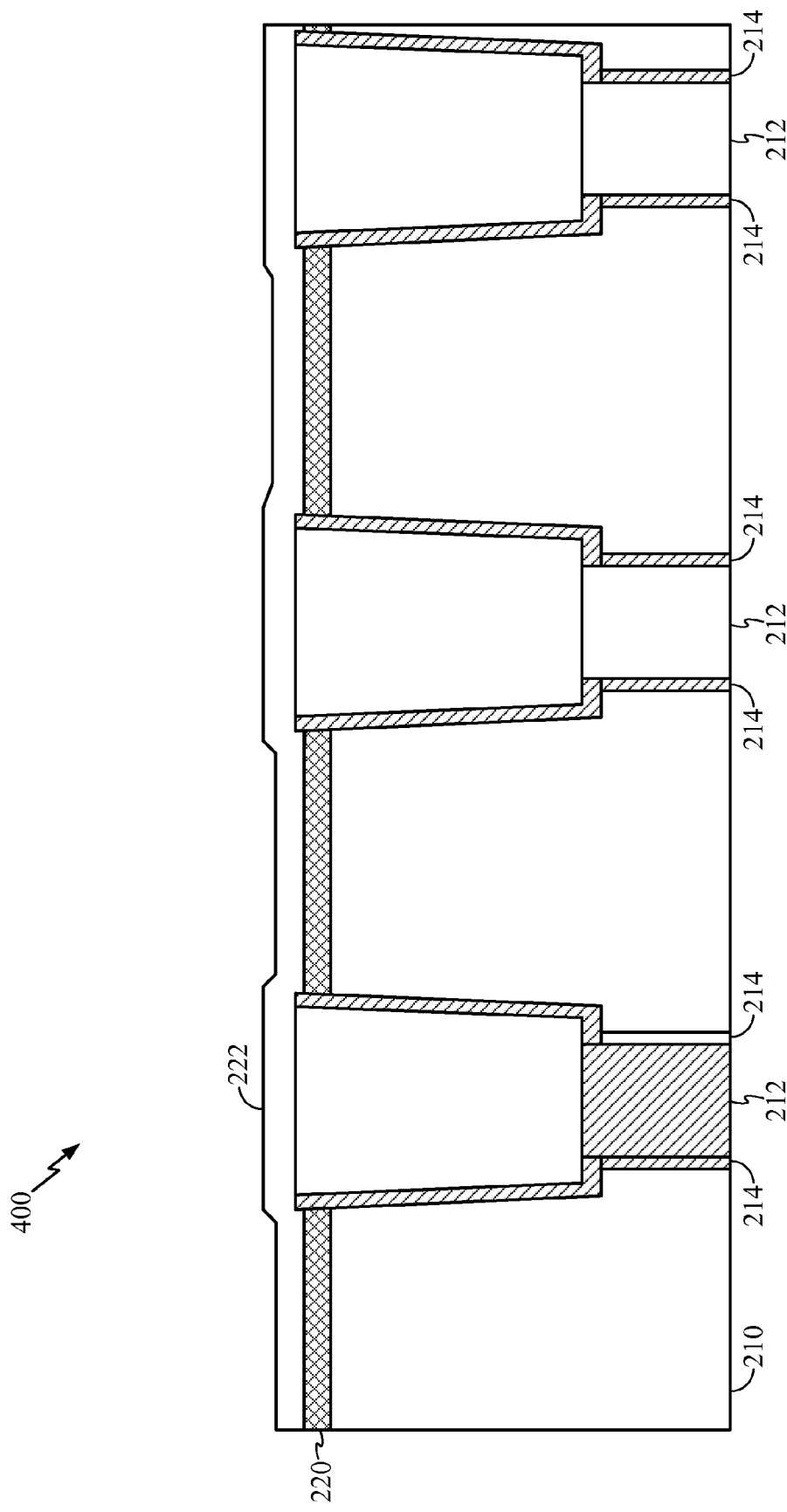
FIG. 4A is a cross-sectional view illustrating exemplary partial MTJ devices after deposition of a bottom electrode layer according to a second embodiment.
Figure 4B:
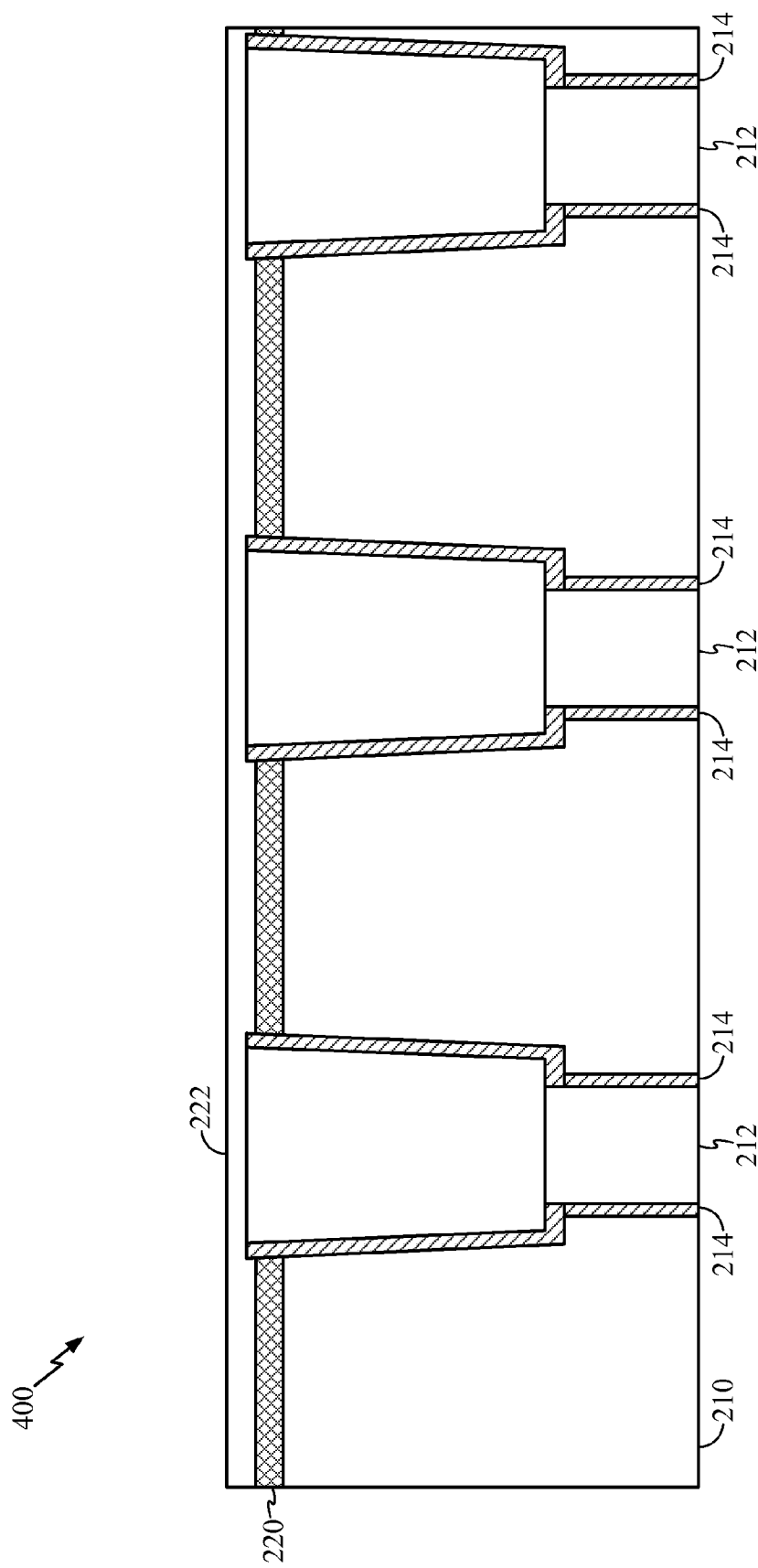
FIG. 4B is a cross-sectional view illustrating exemplary partial MTJ devices after planarization of the bottom electrode layer according to the second embodiment.
Figure 4C:
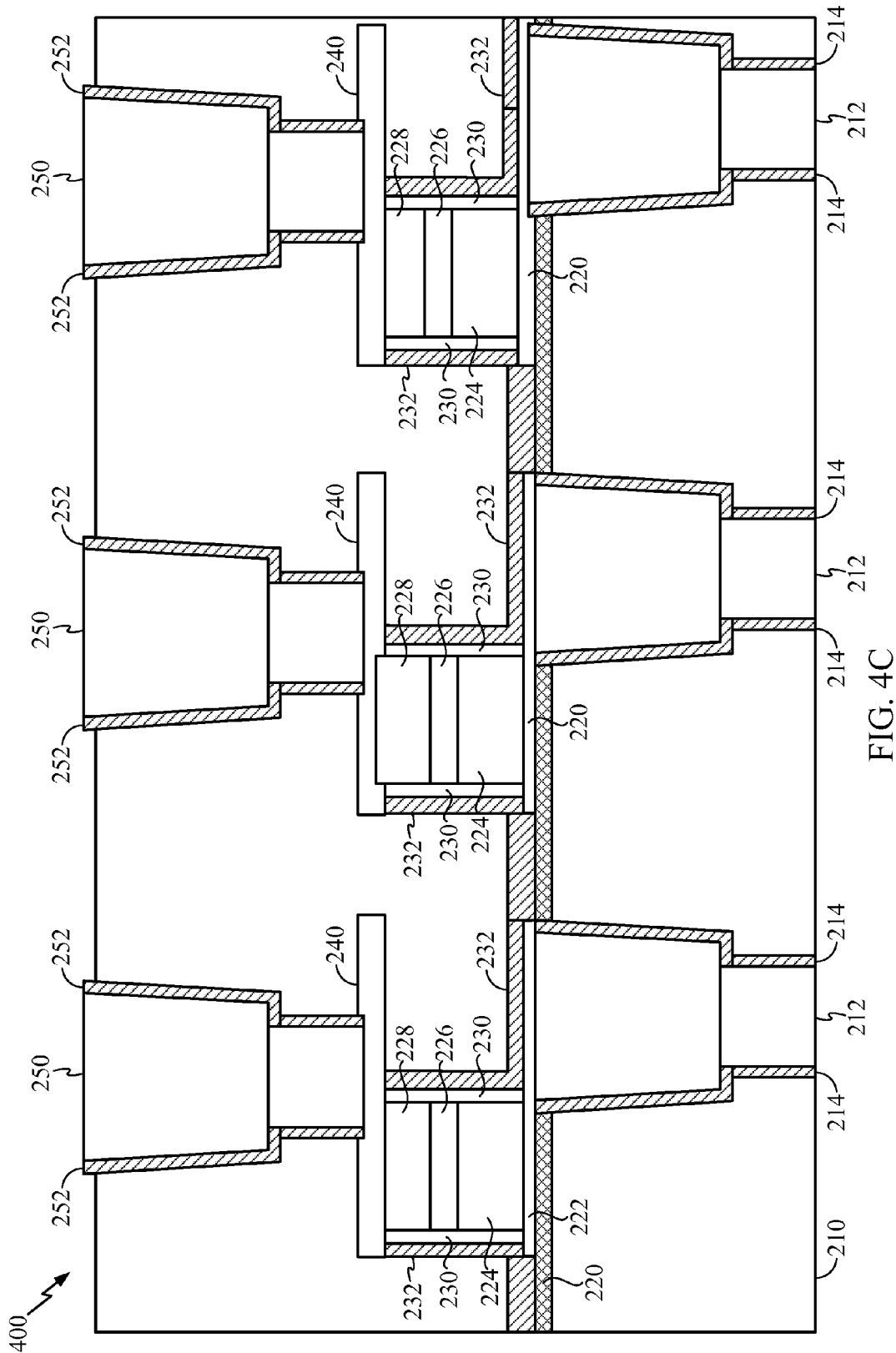
FIG. 4C is a cross-sectional view illustrating exemplary MTJ devices after patterning of the MTJ devices according to the second embodiment.
Figure 5:
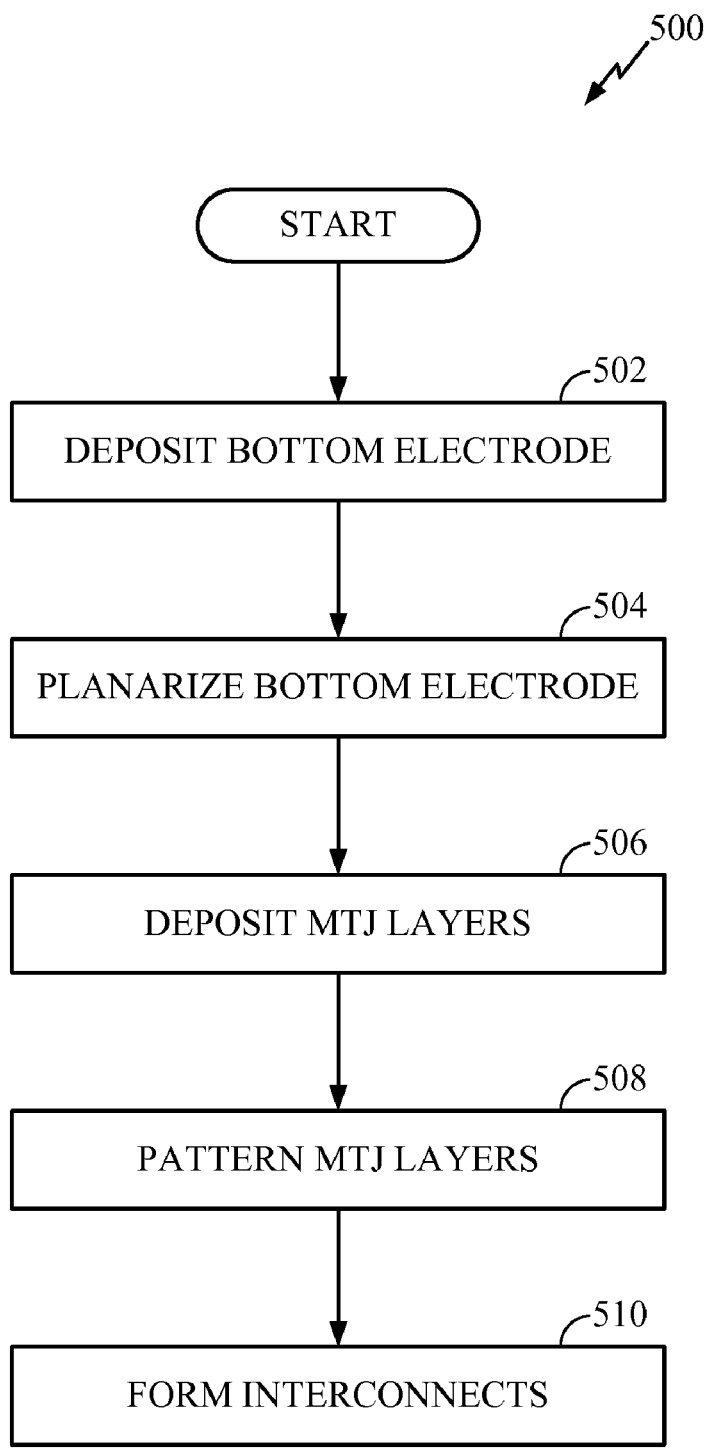
FIG. 5 is a flow chart illustrating an exemplary process for manufacturing MTJ devices according to a second embodiment.

According to a second embodiment, planarization of a bottom electrode layer reduces surface roughness of an MTJ device. Such an embodiment may be employed if the MRAM design includes a bottom electrode layer that directly contacts the bottom metal, rather than using a bottom via (as in the first embodiment described above). FIGS. 4A-4C will now be discussed with reference to FIG. 5 to describe the second embodiment. FIGS. 4A-4C are cross-sectional views illustrating exemplary MTJ device components according to the second embodiment. FIG. 5 is a flow chart illustrating an exemplary process for manufacturing MTJ devices according to the second embodiment.

A flow chart 500 starts at block 502 to deposit the bottom electrode layer 222 on the capping layer 220 and the bottom metal 212. The bottom electrode layer 222 has a surface roughness associated with the height variation between the capping layer 220 and the bottom metal 212 due to conformal coating of the bottom electrode layer 222 after either a bottom metal extrusion process or a cap layer/ILD recess after planarizing the bottom metal 212.

At block 504, the bottom electrode layer 222 is planarized to reduce surface roughness. According to one embodiment, the bottom electrode layer 222 is planarized with chemical mechanical polishing. According to another embodiment, the bottom electrode layer 222 is planarized by depositing a SOM and etching back the SOM.

Planarizing the bottom electrode layer 222 to reduce surface roughness reduces surface roughness of layers deposited on the bottom electrode layer 222. For example, MTJ layers deposited on the bottom electrode layer 222 include magnetic layers such as fixed layers, free layers, antiferromagnetic layers, synthetic antiferromagnetic layers, and spacer layers such as metal oxides. Surface roughness in MTJ layers increases MTJ variation resulting in failure and/or reduces the reliability of MTJ devices fabricated from the MTJ layers. Reducing surface roughness in the bottom electrode layer 222 improves reliability and yield of the MTJ devices fabricated on the bottom electrode layer 222.

FIG. 4C is a cross-sectional view illustrating exemplary MTJ devices after patterning of the MTJ devices according to the second embodiment. After planarization of the bottom electrode layer 222 at block 504, the flow chart 500 continues to block 506 where MTJ layers 224, 226, 228 are deposited on the bottom electrode layer 222. According to one embodiment, the MTJ layers 224, 226, 228 are annealed in a magnetic field after deposition. Annealing may be used, for example, to set an easy axis of the MTJ devices 400.

As shown in FIG. 4C, the MTJ layers 224, 226, 228 have reduced surface roughness because the bottom electrode layer 222 also has reduced surface roughness. One advantage of the MTJ devices 400 is no restriction placed on the location of the MTJ devices 400 by vias to the bottom metal 212. Magnetic properties of the MTJ devices 400 are more predictable and reliable because of reduced surface roughness in the MTJ layers 224, 226, 228.

At block 508, the MTJ layers 224, 226, 228 are patterned. Additionally, capping layers 230, 232 may be deposited after patterning of the MTJ layers 224, 226, 228. According to one embodiment, the capping layers 230, 232 protect the MTJ layers 224, 226, 228 from oxidation after patterning. At block 510 interconnects are formed and coupled to the MTJ layers 224, 226, 228. According to one embodiment, a dielectric layer is deposited and planarized level with the MTJ layer 228, a top electrode layer 240 is deposited on the MTJ layers 224, 226, 228, and the electrode layers 222, 240 are patterned. Additionally, a dielectric layer 260 is deposited and planarized, and a top metal 250 that couples to the top electrode layer 240 is formed in the dielectric layer 260. A barrier layer 252 isolates the top metal 250 from the dielectric layer 260.

Figure 6:
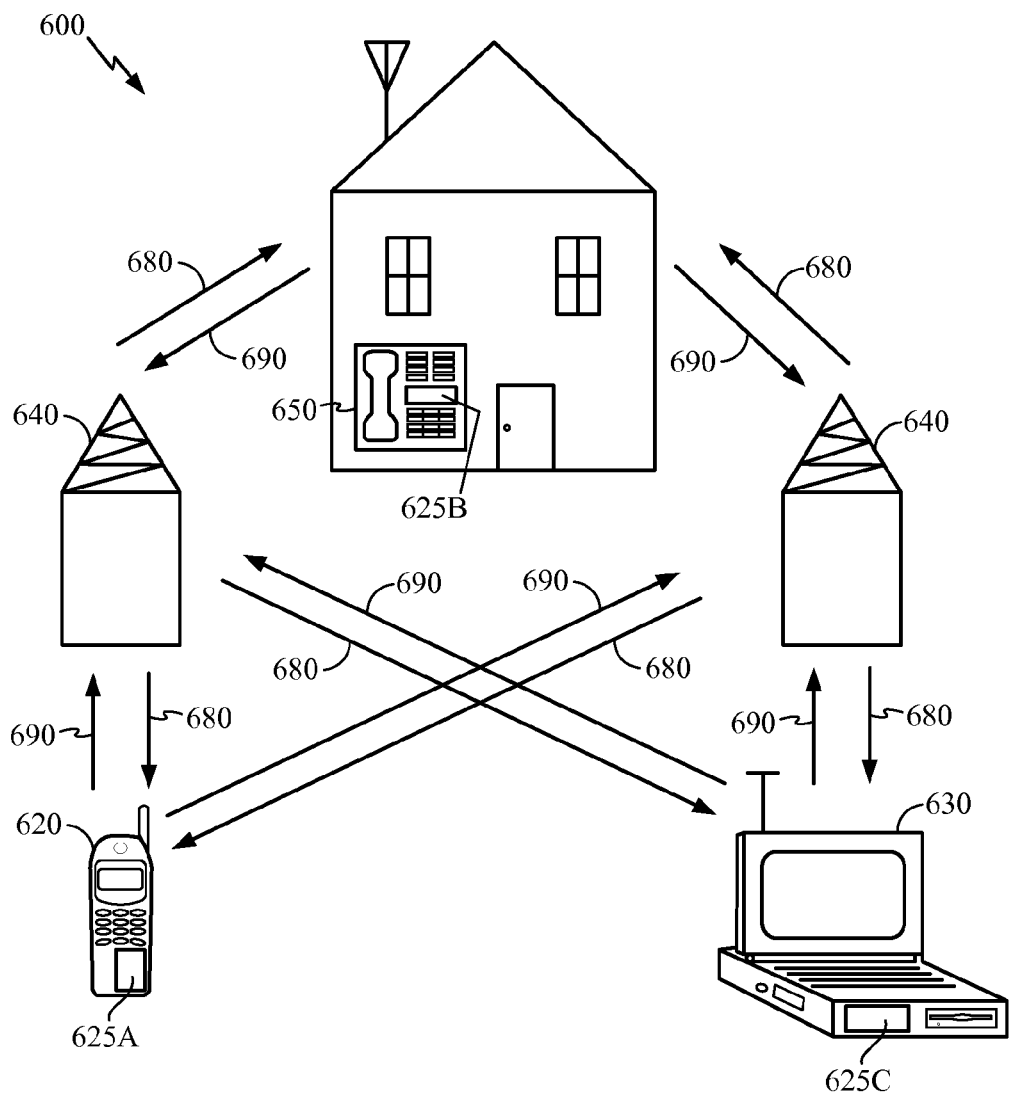
FIG. 6 is a block diagram showing an exemplary wireless communication system in which an embodiment of the invention may be advantageously employed.

An MTJ as shown above may be implemented in a wireless communication system. FIG. 6 shows an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include improved MRAM devices 625A, 625B, and 625C, respectively, which are embodiments as discussed above. FIG. 6 shows forward link signals 680 from the base stations 640 and the remote units 620, 630, and 650 and reverse link signals 690 from the remote units 620, 630, and 650 to base stations 640.

In FIG. 6, the remote unit 620 is shown as a mobile telephone, the remote unit 630 is shown as a portable computer, and the remote unit 650 is shown as a computer in a wireless local loop system. For example, the remote units may be cell phones, hand-held personal communication systems (PCS) units, portable data units such as personal data assistants, or fixed location data units such as meter reading equipment. Although FIG. 6 illustrates remote units according to the teachings of the disclosure, the disclosure is not limited to these exemplary illustrated units. The disclosure may be suitably employed in any device which includes packaged ICs.

Figure 7:
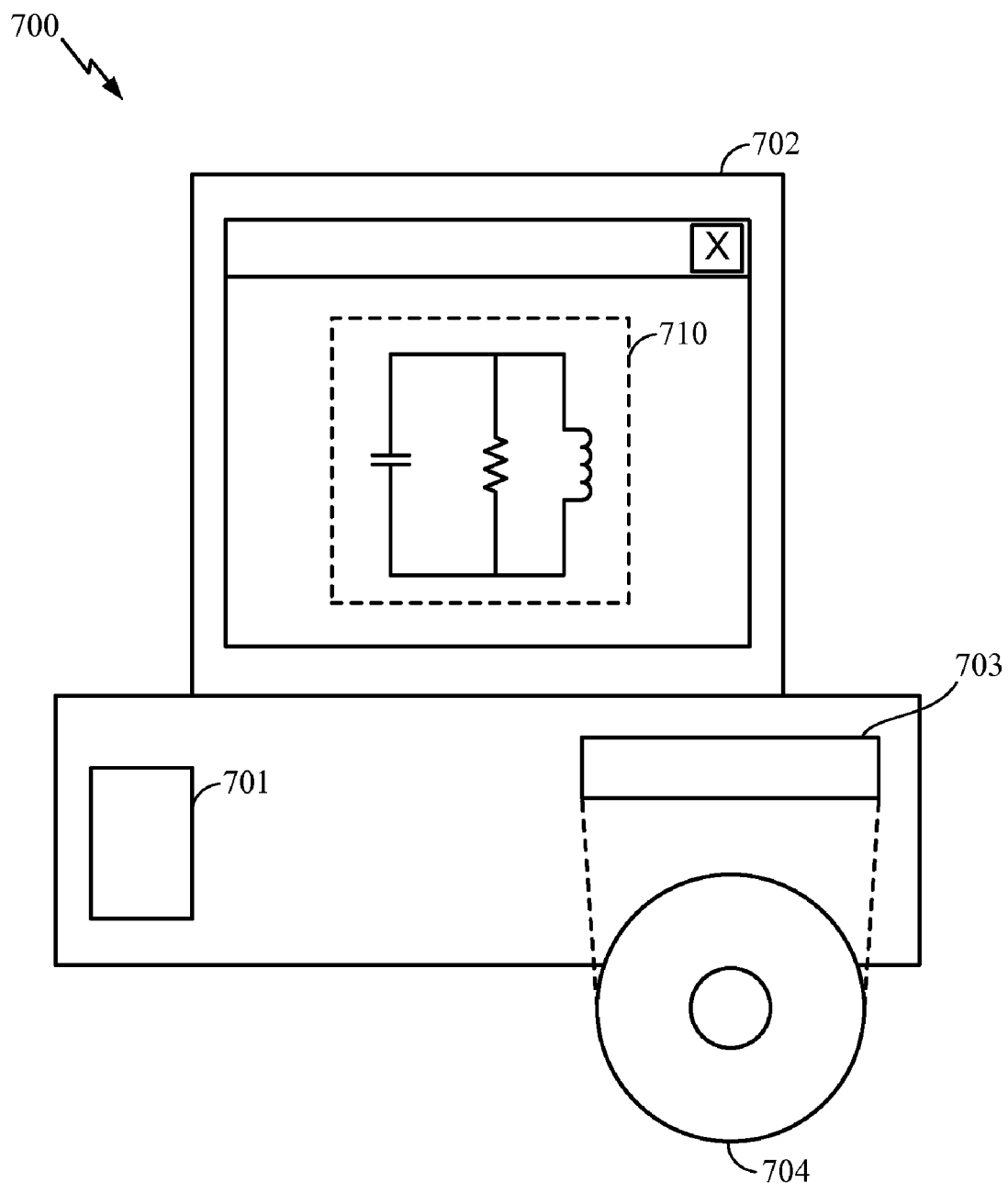
FIG. 7 is a block diagram illustrating a design workstation used for circuit, layout, logic, wafer, die, and layer design of a semiconductor part

FIG. 7 is a block diagram illustrating a design workstation used for circuit, layout, logic, wafer, die, and layer design of a semiconductor part. A design workstation 700 includes a hard disk 701 containing operating system software, support files, and design software such as Cadence or OrCAD. The design workstation 700 also includes a display 702 to facilitate manufacturing of a semiconductor part 710 that may include MRAM. A storage medium 704 is provided for tangibly storing the design of the semiconductor part 710. The design of the semiconductor part 710 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the semiconductor part 710 by decreasing the number of processes for manufacturing circuits, semiconductor wafers, semiconductor dies, or layers contained within an MRAM.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present invention and its advantages have been described in detail, it should be understood that various changes, substitutions and alterations can be made herein without departing from the technology of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A magnetic tunnel junction (MTJ) manufacturing process, comprising:
    depositing a capping layer on a dielectric layer and a bottom metal;
    chemical mechanical polishing the capping layer to form a planarized capping layer;
    patterning a via in the planarized capping layer to the bottom metal before depositing the bottom electrode layer; and
    depositing a bottom electrode layer on the planarized capping layer.

2. The MTJ manufacturing process of claim 1, further comprising depositing MTJ layers on the bottom electrode layer.

3. The MTJ manufacturing process of claim 2, in which the MTJ is integrated into a spin-torque-transfer (STT) magnetic random access memory (MRAM).

4. The MTJ manufacturing process of claim 2, in which the MTJ is integrated into at least one of a microprocessor, set top box, music player, video player, entertainment unit, navigation device, communications device, personal digital assistant (PDA), fixed location data unit, and a computer.

5. The MTJ manufacturing process of claim 1, in which planarizing the capping layer comprises: spinning on a material; and etching back the material.

6. A magnetic tunnel junction (MTJ) manufacturing process, comprising the steps of:
    depositing a capping layer on a dielectric layer and a bottom metal;
    chemical mechanical polishing the capping layer to form a planarized capping layer;
    patterning a via in the planarized capping layer to the bottom metal before depositing the bottom electrode layer; and
    depositing a bottom electrode layer on the planarized capping layer.

7. The MTJ manufacturing process of claim 6, further comprising the step of depositing MTJ layers on the bottom electrode layer.

8. The MTJ manufacturing process of claim 6, in which the MTJ is integrated into at least one of a microprocessor, set top box, music player, video player, entertainment unit, navigation device, communications device, personal digital assistant (PDA), fixed location data unit, and a computer.

9. A magnetic tunnel junction (MTJ) manufacturing process, comprising:
    depositing a bottom electrode layer on a capping layer and a bottom metal;
    planarizing the bottom electrode layer;
    chemical mechanical polishing the capping layer to form a planarized capping layer;
    patterning a via in the planarized capping layer to the bottom metal before depositing the bottom electrode layer; and
    depositing MTJ layers on the planarized bottom electrode layer.

10. The MTJ manufacturing process of claim 9, further comprising patterning the MTJ layers.

11. The MTJ manufacturing process of claim 9, further comprising integrating the MTJ into a spin-torque-transfer (STT) magnetic random access memory (MRAM).

12. The MTJ manufacturing process of claim 9, in which planarizing the bottom electrode layer comprises chemical mechanical polishing the bottom electrode layer.

13. The MTJ manufacturing process of claim 9, in which planarizing the bottom electrode layer comprises: spinning on a material; and etching back the material.

14. The MTJ manufacturing process of claim 9, in which the MTJ is integrated into at least one of a microprocessor, set top box, music player, video player, entertainment unit, navigation device, communications device, personal digital assistant (PDA), fixed location data unit, and a computer.

15. A magnetic tunnel junction (MTJ) manufacturing process, comprising the steps of:
    depositing a bottom electrode layer on a capping layer and a bottom metal;
    planarizing the bottom electrode layer;
    chemical mechanical polishing the capping layer to form a planarized capping layer;
    patterning a via in the planarized capping layer to the bottom metal before depositing the bottom electrode layer; and
    depositing MTJ layers on the planarized bottom electrode layer.

16. The MTJ manufacturing process of claim 15, further comprising the step of integrating the MTJ into a spin-torque-transfer (STT) magnetic random access memory (MRAM).

17. The MTJ manufacturing process of claim 15, in which the MTJ is integrated into at least one of a microprocessor, set top box, music player, video player, entertainment unit, navigation device, communications device, personal digital assistant (PDA) fixed location data unit, and a computer.

* * * * *